US006653229B2

(12) United States Patent
Cox

(10) Patent No.: US 6,653,229 B2
(45) Date of Patent: Nov. 25, 2003

(54) INTEGRATED CIRCUIT WITH A RECESSED CONDUCTIVE LAYER

(75) Inventor: J. Neal Cox, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/060,843

(22) Filed: Jan. 29, 2002

(65) Prior Publication Data

US 2002/0096778 A1 Jul. 25, 2002

Related U.S. Application Data

(62) Division of application No. 09/422,841, filed on Oct. 21, 1999, now Pat. No. 6,383,917.

(51) Int. Cl.[7] ............... H01L 21/4763; H01L 21/8238; H01L 29/76; H01L 29/94; H01L 21/20
(52) U.S. Cl. ............... 438/637; 438/206; 438/245; 438/386; 438/391; 257/301; 257/302; 257/328
(58) Field of Search ............... 438/206, 212, 438/211, 243, 244, 245, 268, 386, 387, 391, 637; 257/301, 302, 328

(56) References Cited

U.S. PATENT DOCUMENTS

| | | | |
|---|---|---|---|
| 5,891,805 A | | 4/1999 | Cheng et al. |
| 6,090,696 A | * | 7/2000 | Jang et al. ............... 438/617 |
| 6,191,025 B1 | | 2/2001 | Liu et al. |
| 6,191,029 B1 | | 2/2001 | Hsiao et al. |
| 6,191,031 B1 | | 2/2001 | Taguchi et al. |
| 6,211,085 B1 | | 4/2001 | Liu |
| 6,251,774 B1 | * | 6/2001 | Harada et al. ............... 438/637 |
| 6,420,261 B2 | * | 7/2002 | Kudo ............... 438/633 |

OTHER PUBLICATIONS

Robert J. Contolini et al., "Electrochemical Planarization for Multilevel Metallization" J. Electrochem. Soc., vol. 141, No. 9, Sep. 1994, The Electrochemical Society, Inc. pp. 2503–2510.

Robert J. Contolini et al., "A Copper Via Plug Process by Electrochemical Planarizsation" 1993 VLSI Multilevel Interconnection Conference, Jun. 8–9, 1993, Santa Clara, Ca.

* cited by examiner

*Primary Examiner*—Caridad Everhart
*Assistant Examiner*—Chuong A Luu
(74) *Attorney, Agent, or Firm*—Mark V. Seeley

(57) ABSTRACT

An improved method for making an integrated circuit. That method includes forming a first dielectric layer on a substrate, etching a trench into that layer, then filling the trench with a conductive material. The conductive material is then electropolished to form a recessed conductive layer within the first dielectric layer.

2 Claims, 4 Drawing Sheets

INTEGRATED CIRCUIT WITH A RECESSED CONDUCTIVE LAYER

This is a Divisional Application of Ser. No.: 09/422,841 filed Oct. 21, 1999, now U.S. Pat. No. 6,383,917.

FIELD OF THE INVENTION

The present invention relates to a method for making integrated circuits.

BACKGROUND OF THE INVENTION

Integrated circuits are made by forming on a substrate, such as a silicon wafer, layers of conductive material that are separated by layers of dielectric material. Trenches may be etched into the dielectric layers, e.g., when forming single or dual damascene interconnect structures, then filled with a conductive material to form conductive layers.

In the conventional process, generally, the surface of a conductive layer formed in a trench is substantially flush with the surface of the dielectric layer or layers that insulate the conductive layer. In some circumstances, such an attribute may be undesirable. Take, for example, an integrated circuit that includes a dielectric layer made from a low dielectric constant material. Such a dielectric layer may ensure that a conductive layer's RC related delays are reduced. Such a layer, however, may have poor mechanical integrity. To improve the mechanical strength of the overall dielectric layer, a second dielectric layer, having a higher dielectric constant and superior mechanical strength, may be formed on the layer with the low dielectric constant. Because that second layer has a relatively high dielectric constant, however, some of the RC delay reducing benefit, which the low dielectric constant material provides, will be lost when such a layer is used to form part of the overall dielectric layer.

There is thus a need for an improved method for making an integrated circuit in which the surface of a conductive layer formed in a trench is recessed from the surface of the dielectric layer or layers that insulate the conductive layer. There is also a need for such a method that produces an integrated circuit that has acceptable RC characteristics, while using mechanically strong dielectric layers to separate the conductive layers. This application describes such a method.

SUMMARY OF THE INVENTION

An improved method for making an integrated circuit is described. That method comprises forming a dielectric layer on a substrate, then etching a trench into that layer. After filling the trench with a conductive material, the conductive material is electropolished to form a recessed conductive layer within the dielectric layer. In a preferred embodiment, a dielectric layer having a relatively high dielectric constant is formed on top of a dielectric layer having a relatively low dielectric constant. A trench is etched through the upper layer and into the lower layer, then filled with a conductive material. That conductive material is then electropolished to form a recessed conductive layer that is separated from the dielectric layer that has a relatively high dielectric constant.

DETAILED DESCRIPTION OF THE PRESENT INVENTION

Figure 1A:
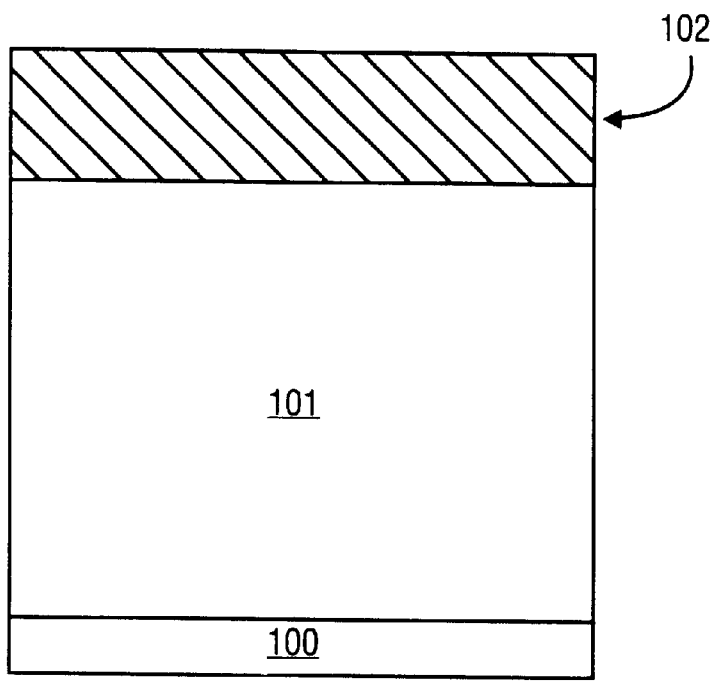
FIGS. 1a–1g represent cross-sections of structures that may result when certain steps are used to carry out an embodiment of the method of the present invention.
Figure 1B:
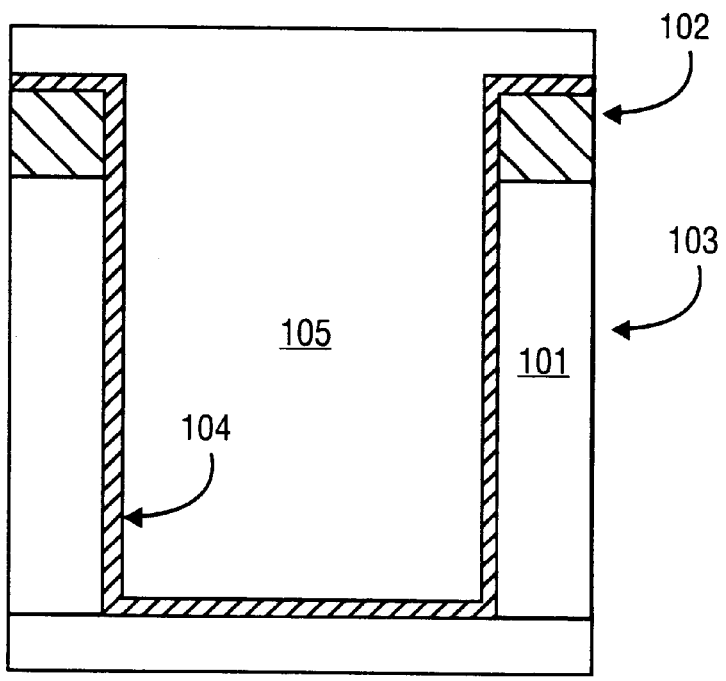

An improved method for making an integrated circuit is described. In that method, first dielectric layer 101 is formed on substrate 100, as shown in FIG. 1a. Substrate 100 may be any surface, generated when making an integrated circuit, upon which a dielectric layer may be formed. Substrate 100 thus may include, for example, active and passive devices that are formed on a silicon wafer such as transistors, capacitors, resistors, diffused junctions, gate electrodes, local interconnects, etc. . . . Substrate 100 also may include previously formed dielectric layers that separate such active and passive devices from the conductive layer or layers that are formed on top of them, or that separate various conductive layers from each other.

First dielectric layer 101 may comprise any material that may insulate one conductive layer from another. Examples of such materials include silicon dioxide (either undoped or doped with phosphorus (PSG) or boron and phosphorus (BPSG)); silicon nitride; silicon oxy-nitride; porous oxide; an organic containing silicon oxide; or a polymer. Preferred are polymers with a low dielectric constant: preferably less than about 3.5 and more preferably between about 1.5 and about 3.0. When layer 101 is made from a polymer having a low dielectric constant, the capacitance between various conductive elements that are separated by layer 101 should be reduced, when compared to the capacitance resulting from use of other conventionally used dielectric materials—such as silicon dioxide. Such reduced capacitance may decrease the RC delay that would otherwise exist and may also decrease undesirable cross-talk between conductive lines.

First dielectric layer 101 may comprise an organic polymer. Such organic polymers include, for example, polyimides, parylenes, polyarylethers, organo-silicones, polynaphthalenes, and polyquinolines, or copolymers thereof. A commercially available polymer sold by Allied Signal, Inc., under the trade name FLARE™, may be used to form first dielectric layer 101. When first dielectric layer 101 comprises a polymer, it is preferably formed by spin coating the polymer onto the surface of substrate 100, using conventional equipment and process steps.

First dielectric layer 101 may alternatively be made from a compound having the molecular structure $Si_xO_yR_z$, in which R is selected from the group consisting of hydrogen, carbon, an aliphatic hydrocarbon and an aromatic hydrocarbon. When "R" is an alkyl or aryl group, the resulting composition is often referred to as carbon-doped oxide. When first dielectric layer 101 comprises a carbon-doped oxide, dielectric layer 101 preferably includes between about 5 and about 50 atom % carbon. More preferably, such a compound includes about 15 atom % carbon.

Examples of other types of materials that may be used to form dielectric layer 101 include aerogel, xerogel, and spin-on-glass ("SOG"). In addition, dielectric layer 101 may comprise either hydrogen silsesquioxane ("HSQ"), methyl silsesquioxane ("MSQ"), or other materials having the molecular structure specified above, which may be coated onto the surface of a semiconductor wafer using a conventional spin coating process. Although spin coating may be a preferred way to form layer 101 for some materials, for others chemical vapor deposition (e.g., plasma enhanced chemical vapor deposition—"PECVD"), a Sol-Gel process, or foaming techniques may be preferred. First dielectric layer 101 preferably has a thickness of between about 100 and about 1,000 nanometers.

In the embodiment of the present invention described with reference to FIGS. 1a–1g, second dielectric layer 102 is formed on the surface of first dielectric layer 101. Second dielectric layer 102 preferably comprises a material that is mechanically stronger than the material used to form first dielectric layer 101. Some examples of materials that may be used to form layer 102 include silicon nitride, silicon dioxide, and silicon oxy-nitride. Second dielectric layer 102 may be formed using a conventional chemical vapor deposition process, and preferably is between about 10 and about 200 nanometers thick. Combining first layer 101 (which may enable improved RC characteristics, but has poor mechanical integrity) with second layer 102 (which may increase RC delay, but provide superior mechanical strength) creates an overall dielectric layer that may ensure improved RC performance while retaining suitable mechanical strength properties.

After forming second dielectric layer 102 on first dielectric layer 101, a photoresist layer is deposited and patterned, e.g., by using conventional photolithographic techniques, to define a trench that will be etched into dielectric layer 103—dielectric layer 103 comprising the combination of layers 101 and 102. After that trench is etched, e.g., by using a conventional etch process, barrier layer 104 is formed, which lines the trench bottom and walls. Conductive layer 105 is then formed on barrier layer 104, generating the structure shown in FIG. 1b.

Barrier layer 104 is formed to block diffusion into dielectric layer 103 of copper or other elements that may be included in conductive layer 105. Barrier layer 104 preferably comprises a refractory material, such as tantalum, tantalum nitride or titanium nitride, but may be made from other materials that can inhibit diffusion from conductive layer 105 into dielectric layer 103. Barrier layer 104 preferably is between about 10 and 50 nanometers thick, and preferably is formed using a conformal chemical vapor deposition process.

Conductive layer 105 may be made from materials conventionally used to form conductive layers for integrated circuits. For example, conductive layer 105 may be made from copper, a copper alloy, aluminum or an aluminum alloy, such as an aluminum/copper alloy. Alternatively, conductive layer 105 may be made from doped polysilicon or a silicide, e.g., a silicide comprising tungsten, titanium, nickel or cobalt. Preferably, conductive layer 105 consists essentially of copper.

Although a few examples of the types of materials that may form conductive layer 105 have been identified here, that layer may be formed from various other materials that can serve to conduct electricity within an integrated circuit. Although copper is preferred, the use of any other conducting material, which may be used to make an integrated circuit, falls within the spirit and scope of the present invention.

Conductive layer 105 may be formed by a chemical vapor or physical deposition process, as is well known to those skilled in the art. Alternatively, where copper forms conductive layer 105, a conventional copper electroplating process may be used. Such a process typically comprises depositing a barrier layer (e.g., barrier layer 104 shown in FIG. 1b) followed by depositing a seed material, then performing a copper electroplating process to produce the copper line. Such a process is described in copending applications Ser. Nos. 163,847 and 223,472 (filed Sep. 30, 1998 and Dec. 30, 1998, respectively, and each assigned to this application's assignee), and is well known to those skilled in the art. Suitable seed materials for the deposition of copper include copper and nickel.

In a typical process, after conductive layer 105 is deposited, it is polished, e.g., by applying a conventional chemical mechanical polishing ("CMP") step, until its surface is substantially flush with the surface of dielectric layer 103. Applicant has found, however, that removing substantially more of conductive layer 105, without similarly removing additional amounts of layer 103, to form a recessed conductive layer within layer 103 enables processing options that are not available, when those layers' surfaces are maintained at substantially the same level. For example, as described below, such a process enables production of an integrated circuit that maintains the strength characteristics imparted by second layer 102, without that layer adversely affecting the improved RC properties that first layer 101 ensures.

One way to remove portions of conductive layer 105, without removing substantial parts of dielectric layer 103, is to electropolish layer 105. When layer 105 comprises copper, an electropolish process may be a particularly preferred way to generate a recessed conductive layer—as copper may be difficult to etch or remove in a controlled manner using other procedures. Such a process will generally require that electrical contact be maintained to conductive layer 105. In the embodiment described herein, electrical contact may be maintained with conductive layer 105 because layer 105 is formed on a dissimilar, relatively thin, conductive layer that lines the trench—i.e., barrier layer 104.

The electropolish process itself is well known to those skilled in the art, consisting essentially of contacting the surface to be polished with an appropriate solution chemistry, then applying an electrical potential to that surface. See, e.g., R. Contolini, A. Bernhardt, and S. Mayer, *Electrochemical Planarization for Multilevel Metallization,* J. Electrochem. Soc., Vol. 141, No. 9, pp. 2503–2510 (September 1994). Such a process may enable the controlled, selective removal of copper from the surface of a copper layer. In one example, portions of a copper layer may be removed by exposing that layer's surface to a phosphoric acid containing solution, then applying an electrical potential of between about 1 and about 1.5V (with respect to a copper reference electrode) for a period of time sufficient to remove the desired amount of copper from the copper layer. The electrical potential may be applied in a steady state fashion, or alternatively, in a dynamic fashion—e.g., by using pulsed plating. Preferably, current density is maintained between about 15 and about 20 mA/cm$^2$. In a preferred embodiment, conductive layer 105 is polished until its surface 114 is separated from second dielectric layer 102 by at least about 10 nanometers, and more preferably by at least about 50 nanometers.

As the electropolishing process penetrates and removes copper from the underlying conductive layer, local electric fields may vary significantly—especially when the copper layer is polished down to the portions of barrier layer 104, which cover second dielectric layer 102. As this occurs, it may be desirable to optimize the process to account for these changes in local fields, which could affect the uniformity of the etch rate. This effect may be addressed, for example, by: (1) applying dynamic fields; (2) using certain chemical additives that act as plating suppressors or antisuppressors to modulate the electropolishing; and/or (3) increasing the surface area of the conductive material—e.g., by adding dummy metal regions to the structure.

Figure 1C:
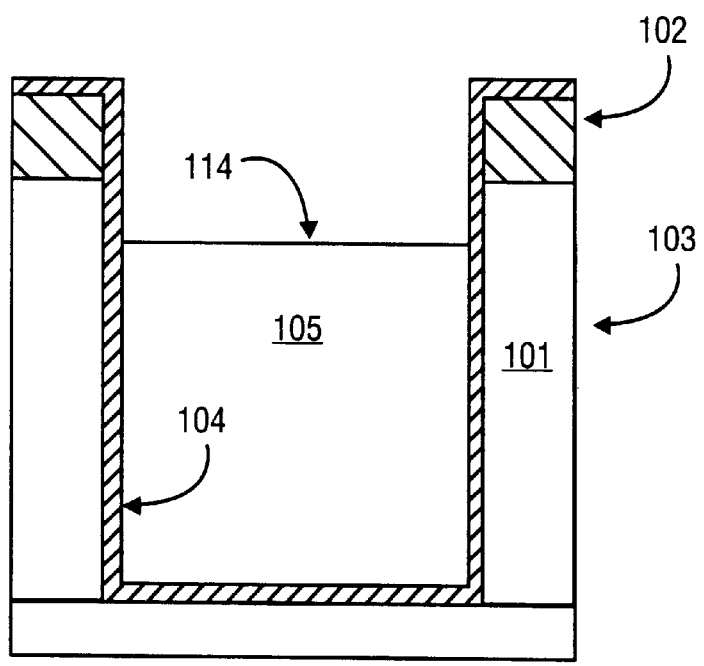

Electropolishing conductive layer 105 produces the structure shown in FIG. 1c. Although the embodiment described above specifies copper for conductive layer 105, preferably formed on a tantalum barrier layer, an electropolish process may be used for the controlled removal of other metals, which have been deposited on an underlying, dissimilar, conductive layer.

Figure 1D:
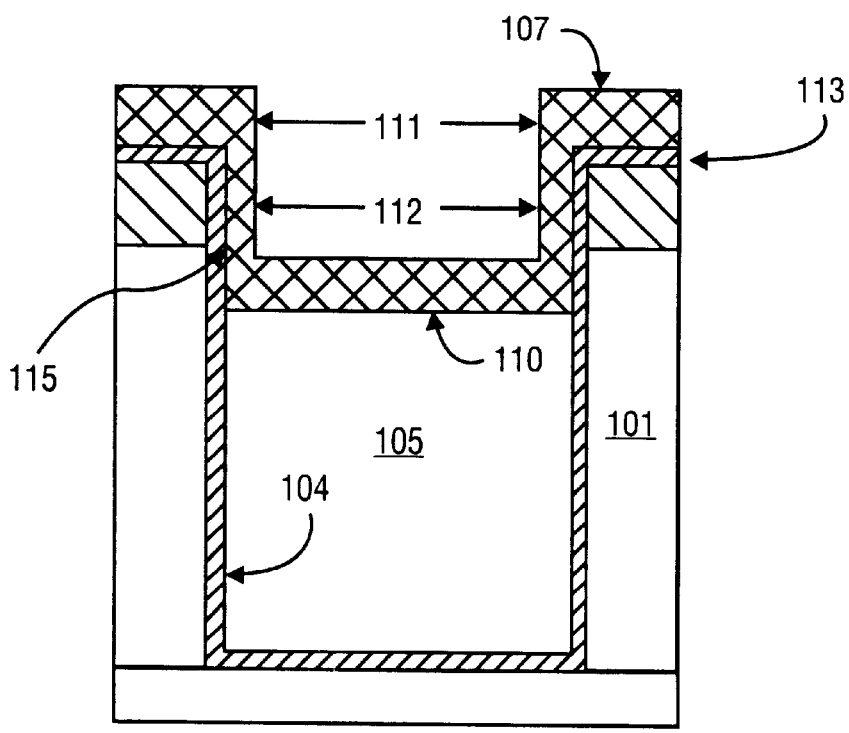

After electropolishing conductive layer 105, a two step process follows to form second barrier layer 106 to completely encapsulate conductive layer 105. First, layer 107 (like layer 104 preferably comprising tantalum, but which alternatively may comprise tantalum nitride or titanium nitride) is deposited over first barrier layer 104 and conductive layer 105 using, for example, a conventional chemical vapor deposition process. In a preferred embodiment, layer 107 is deposited in an anisotropic fashion such that portions 110, 111 of layer 107 (covering conductive layer 105 and horizontal portion 113 of barrier layer 104, respectively) are substantially thicker than portions 112 of layer 107 that line the walls of the trench. The resulting structure is shown in FIG. 1d.

Figure 1E:
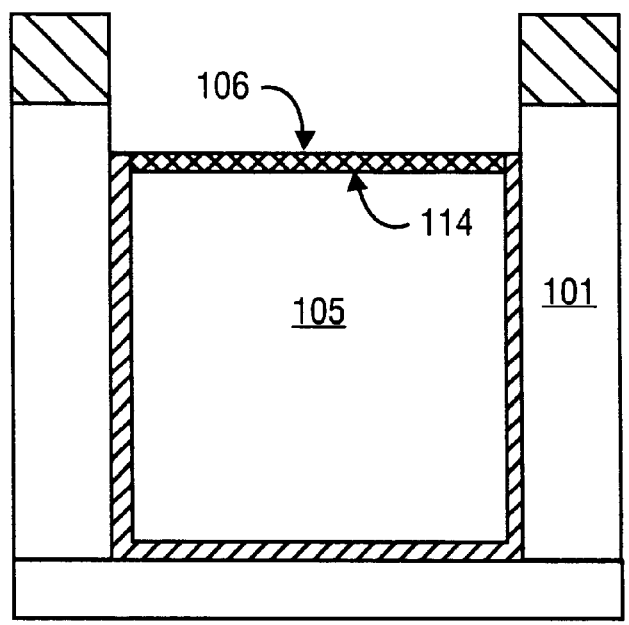

Next, portions 112 of layer 107 and portions 115 of layer 104, which line the trench walls, are removed. In a preferred embodiment, a conventional isotropic etch step is applied to remove substantially all of portions 112 and 115 of layers 107 and 104 from the trench walls. Such an isotropic etch step should remove only part of portions 110, 111 of layer 107, which sit on top of conductive layer 105 and on top of barrier layer 104. Following that etch step, a conventional CMP step may be used to remove the remainder of portion 111 of layer 107 and underlying portion 113 of layer 104, while retaining portion 110 of layer 107. After such a CMP step, the resulting structure includes second barrier layer 106 formed on surface 114 of conductive layer 105, as shown in FIG. 1e.

Second barrier layer 106, like layer 104, will serve to prevent an unacceptable amount of copper, or other metal, from diffusing from conductive layer 105 into any overlying dielectric layer. Although second barrier layer 106 preferably is made from tantalum, that layer may be made from other materials that can serve this function, as is well known to those skilled in the art.

Figure 1F:
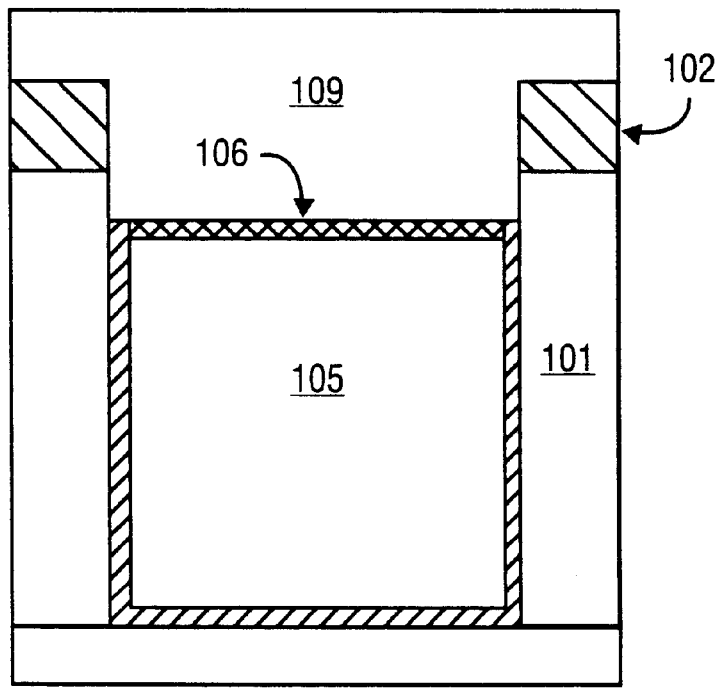

After forming second barrier layer 106, third dielectric layer 109 may be deposited on its surface, as shown in FIG. 1f. Layer 109, like layer 101, preferably has a low dielectric constant. The same materials, process steps and equipment used to form layer 101 may be used to form layer 109. Alternatively, different materials may be used to form those two layers. In the resulting structure, low dielectric constant layers 101 and 109 completely surround conductive layer 105, ensuring acceptable RC delay. High dielectric constant layer 102, which preferably is mechanically stronger than layers 101 and 109, is separated from layer 105 to reduce layer 102's effect on conductive layer 105's RC properties.

Figure 1G:
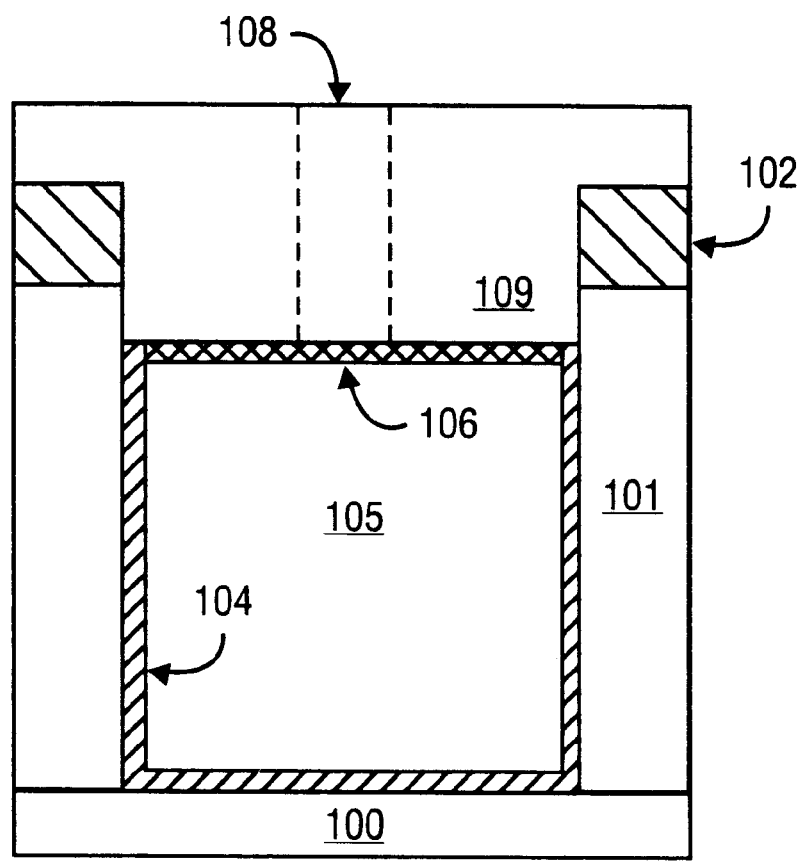

After forming layer 109, via 108 may be etched through it, as shown in FIG. 1g. Via 108 will be filled with a conductive material that will contact conductive layer 105. If layer 109 comprises a polymer, it may be desirable to form a hard masking layer on top of layer 109 prior to etching the via through it. Such a hard mask may ensure that process steps used to remove the photoresist or clean the via do not erode layer 109. Preferred materials for making such a hard masking layer are silicon nitride and silicon dioxide, although other materials, such as SiOF, may be used. When a hard mask is formed on top of third dielectric layer 109, a two step etch process may be required—the first step for etching through the hard mask and the second step for etching through third dielectric layer 109.

When copper is used for conductive layer 105, it may be desirable to remove the portion of second barrier layer 106 that separates via 108 from conductive layer 105 before filling via 108. Such a removal step may help ensure good contact between conductive layer 105 and the filled via. The conductive material that fills via 108 preferably comprises copper, but may instead comprise other materials. In this regard, although preferably the same type of conductive material forms conductive layer 105 and fills via 108, different materials may be used without departing from the spirit and scope of the present invention. (Hash marks shown in FIG. 1g indicate that via 108 may be formed within the integrated circuit at a distance removed from the surface of the depicted cross-section.)

After via 108 is filled, the resulting damascene structure includes a recessed conductive layer 105 spaced sufficiently far from dielectric layer 102 to ensure that layer 102 will not significantly degrade conductive layer 105's favorable RC properties, which low dielectric constant layers 101 and 109 facilitate. To achieve such a structure, the trench etched through dielectric layer 103 (shown in FIG. 1b) will be deeper than it would otherwise have been, if the surfaces of conductive layer 105 and layer 102 were maintained at substantially the same level. Note, however, that adding the conductive layer recess step does not require changing the aspect ratios of via 108 and conductive layer 105 from what they would have been had conductive layer 105 not been sunk below the high dielectric constant layer. Those aspect ratios may remain substantially the same because the reduced thickness of layer 109, where it lies above layer 102, compensates for the increase in thickness of layer 101, required for the deeper trench.

As shown in FIG. 1g, the integrated circuit made by this embodiment of the method of the present invention includes the following features. Conductive layer 105, preferably comprising copper, is formed on substrate 100. Conductive layer 105 is enclosed by barrier layers 104, 106, which, in turn, are enclosed by first dielectric layer 101 and third dielectric layer 109—each preferably having a dielectric constant that is less than about 3.5. Second dielectric layer 102, preferably mechanically stronger than layers 101 and 109, is formed on layer 101. Because layer 102 may have a dielectric constant that is greater than those of layers 101 and 109, layer 102 preferably is separated from conductive layer 105 by at least about 10 nanometers—and more preferably at least about 50 nanometers. Via 108 is formed through third dielectric layer 109 to enable contact between an upper conductive layer (not shown) and conductive layer 105.

Although via 108 is shown in substantial perfect alignment with conductive layer 105, in some processes via 108 may be formed off center from conductive layer 105. If seriously misaligned, part of via 108 may have to be cut through layers 102 and 101 in addition to layer 109. (The same circumstance may exist if a process is designed so that at least part of via 108 must be etched through all three dielectric layers.) If those layers each have different etch characteristics, then etching such a misaligned via may be more complicated for the process of the present invention, than it would have been for a process in which conductive layer 105's surface is flush with layer 102's surface.

Forming a recessed conductive layer within a trench enables new ways to orient conductive layers with respect to the dielectric layers that separate them. As shown above, the method of the present invention can be advantageously applied to processes for making integrated circuits that include a dielectric layer, which comprises both a high dielectric constant layer and a low dielectric constant layer. When making such a device, if the high dielectric constant material is positioned relatively close to the conductive layer, then RC characteristics may be degraded—when compared to those present when the conductive layer is positioned relatively close to the low dielectric constant layer only. By forming a recessed conductive layer that is spaced from the high dielectric constant layer, favorable RC properties may be maintained while still retaining the superior mechanical strength benefits that the high dielectric constant layer provides.

Unlike prior processes, such a method, which forms a recessed conductive layer separated from a high dielectric constant layer, enables a process that does not require sacrificing superior RC characteristics in order to enhance mechanical strength properties. Such a method enables the resulting device to have the best of both worlds—improved RC properties and adequate mechanical strength.

Features shown in the above referenced drawings are not intended to be drawn to scale, nor are they intended to be shown in precise positional relationship. Additional steps that may be included in the above described method have been omitted as they are not useful to describe aspects of the present invention.

Although the foregoing description has specified certain steps, materials, and equipment that may be used in such a method to make such an integrated circuit, those skilled in the art will appreciate that many modifications and substitutions may be made. For example, although the improved method of the present invention has been described in the context of forming a recessed conductive layer to enable separation of that layer from a high dielectric constant layer to minimize that layer's effect on the conductive layer's RC properties, this invention is not limited to that particular application. Any process that forms a recessed conductive layer within a trench formed in a dielectric layer using electropolishing to etch the layer falls within the spirit and scope of the present invention.

Moreover, although the embodiment described with reference to FIGS. 1a–g shows only one overall dielectric layer and one conductive layer, the number of conductive and dielectric layers included in the resulting integrated circuit may vary, as is well known to those skilled in the art. In this regard, the process described above may be repeated to form additional conductive and insulating layers until the desired integrated circuit is produced. Accordingly, it is intended that all such modifications, alterations, substitutions and additions be considered to fall within the spirit and scope of the invention as defined by the appended claims.

What is claimed is:

1. An integrated circuit comprising:
   a conductive layer comprising copper formed on a substrate;
   a first conductive barrier layer formed between the conductive layer and a first dielectric layer, the first dielectric layer having a dielectric constant that is less than about 3.5;
   a second dielectric layer formed on the first dielectric layer but not over the conductive layer, the second dielectric layer having a dielectric constant that is greater that the dielectric constant of the first dielectric layer and having a mechanical strength that is greater than the mechanical strength of the first dielectric layer;
   a second barrier layer formed between the conductive layer and a third dielectric layer, the third dielectric layer formed on top of the conductive layer and having a dielectric constant that is less than about 3.5; and
   wherein
   the conductive layer is separated from the second dielectric layer by at least about 10 nanometers.

2. The integrated circuit of claim 1 wherein the first and second barrier layers are each formed from a refractory metal selected from the group consisting of tantalum, tantalum nitride, and titanium nitride; the first and third dielectric layers each comprise a polymer selected from the group consisting of polyimides, parylenes, polyarylethers, organosilicones, polynaphthalenes, and polyquinolines, or copolymers thereof, and the second dielectric layer comprises an insulating material selected from the group consisting of silicon nitride, silicon dioxide and silicon oxy-nitride.

* * * * *